US005740179A

United States Patent [19]
Dorney et al.

[11] Patent Number: 5,740,179
[45] Date of Patent: Apr. 14, 1998

[54] METHOD AND APPARATUS FOR A DESIGN FOR TEST, PARALLEL BLOCK WRITE OPERATION

[75] Inventors: Timothy Dominic Dorney, Houston; Anthony Michael Balistreri, Sugar Land, both of Tex.

[73] Assignee: Texas Instruments Incorporated, Dallas, Tex.

[21] Appl. No.: 707,044

[22] Filed: Aug. 30, 1996

Related U.S. Application Data

[63] Continuation of Ser. No. 235,591, Apr. 29, 1994, abandoned.
[51] Int. Cl.$^6$ ...................................................... G11C 29/00
[52] U.S. Cl. ............................................................ 371/21.2
[58] Field of Search .................................. 371/21.1, 21.2, 371/21.3; 365/201; 364/265, 267.4, 268.5

[56] References Cited

U.S. PATENT DOCUMENTS

| | | | |
|---|---|---|---|
| 4,860,259 | 8/1989 | Tobita | 365/201 |
| 4,873,669 | 10/1989 | Furutani et al. | 365/189.01 |
| 4,961,171 | 10/1990 | Pinkham et al. | 365/230.05 |
| 5,016,220 | 5/1991 | Yamagata | 365/201 |
| 5,029,330 | 7/1991 | Kajigaya | 365/201 |
| 5,138,619 | 8/1992 | Fasang et al. | 371/21.1 |
| 5,185,744 | 2/1993 | Arimoto et al. | 371/21.2 |
| 5,216,673 | 6/1993 | Kanai | 371/21.2 |
| 5,228,000 | 7/1993 | Yamagata | 365/201 |

*Primary Examiner*—Robert W. Beausoliel, Jr.
*Assistant Examiner*—Stephen C. Elmore
*Attorney, Agent, or Firm*—William W. Holloway; Wade James Brady; Richard L. Donaldson

[57] ABSTRACT

An integrated circuit memory device (21) includes plural input/output pins (30, 127 and others) and plural arrays of addressable storage cells (31–46). A set of circuits (51, 68, 70, 71–86, 90) provides access to a unique storage location in each array (31–46) through a given row and column address. A writing circuit (47, 68, 70, 71–86, 91–106, 131–146), designed for test, provides in parallel plural copies of a test data bit. The test data bit is applied through a single pin (30) and a common data-in lead (68), for storage in an addressed storage cell in each of the arrays. A readout circuit (110, 111, 112, 171, 127, 201–216, 131–146) is arranged for reading out the stored test data bit from the addressed storage cell in each of the arrays (31–46). The writing circuit, while in a block write test mode, stores the test data bit on the common data-in lead (68) in a block of address locations in each array (31–46).

20 Claims, 6 Drawing Sheets

TRUTH TABLE - COMPARATOR 110

| INPUTS | | OUTPUT |
|---|---|---|
| EXPECTED DATA BIT ON LEAD 68 | ALL DATA ON LEADS 201-216 | DATA ON LEAD 217 |
| 0 | 0 | 0 |
| 0 | MIXED | 1 |
| 0 | 1 | 1 |
| 1 | 0 | 0 |
| 1 | MIXED | 0 |
| 1 | 1 | 1 |

*FIG. 6*

TRUTH TABLE - OUTPUT MULTIPLEXER 111

| INPUTS | | | OUTPUT |
|---|---|---|---|
| BWT MODE | DATA ON LEAD 201 | DATA ON LEAD 217 | DATA ON LEAD 127 |
| ENABLED | – | 0 | 0 |
| ENABLED | – | 1 | 1 |
| DISABLED | 0 | – | 0 |
| DISABLED | 1 | – | 1 |

*FIG. 7*

TRUTH TABLE
SPECIAL FUNCTION SIGNAL GENERATOR FOR NONDFT WRITE OPERATIONS

| STATE OF DSF ON FALL OF $\overline{RAS}$ | STATE OF DSF ON FALL OF $\overline{CAS}$ | OPERATION |
|---|---|---|
| 0 | 0 | NORMAL WRITE |
| 0 | 1 | BLOCK WRITE |
| 1 | 0 | LOAD WRITE MASK REGISTER |
| 1 | 1 | LOAD COLOR REGISTER |

*FIG. 8*

METHOD AND APPARATUS FOR A DESIGN FOR TEST, PARALLEL BLOCK WRITE OPERATION

This application is a continuation of application Ser. No. 08/235,591, filed Apr. 4, 1994, now abandoned.

CROSS REFERENCE TO A RELATED PATENT APPLICATION

This application refers to and incorporates by reference a copending and co-assigned patent application of Texas Instruments, Ser. No. 988,553, filed Dec. 10, 1992 (TI-17379).

FIELD OF THE INVENTION

This invention relates to an integrated circuit memory device and more particularly to a wide I/O memory device designed for test.

BACKGROUND OF THE INVENTION

Integrated circuit memory devices store information in arrays of cells arranged in addressable rows and columns. During fabrication of these devices, one or more defects may occur and prevent the proper performance of the memory circuit. Some types of defects may be analyzed and corrected on the device. Other types of defects may not be corrected and are the cause of a failed device. Distribution of defects in any memory device may be random. The yield of good devices per wafer can be improved over time by eliminating the causes of such defects.

Integrated circuit memories are being made with increasing bit densities, smaller storage cell sizes, and more input/output pins, as the generations of new memory devices are designed and built. As a result, devices are more susceptible to defects caused by processing variations and reduced tolerances. Testing must be done to detect and correct the defects so that sufficiently high device yields are achieved for profitable production.

Problems arise in testing integrated circuit devices with greater densities and with more input/output pins. Memory devices, which have more storage cells require longer test sequences to be run. Therefore, more device tester time is required for testing each device. Also, end users desire to use more and more input/output pins per device. Such wide input/output pin devices inherently limit the number of such devices which can be tested at one time on a device tester. Thus fewer of the wide input/output devices can be tested simultaneously on one device tester. Both the increase in test time and the reduced number of devices that can be tested simultaneously make testing an ever increasing expense.

In response to the dilemma which has developed, the Electronic Industries Association's Joint Electron Device Engineering Council (JEDEC) has undertaken a project to establish a parallel write, parallel read design for test (DFT) interface specification for memory devices. The test interface specification includes a single input data pin for writing the data to all input circuits of the test device. During a test write operation, a data bit, received on the single input data pin, is written concurrently to a single address in each of the storage arrays of the memory device.

Subsequently to perform the test read operation, the stored data bit is simultaneously read out of all of the arrays of the memory device. The data bit read from each array is compared with an expected data bit. If all of the data bits read out of the arrays agree with the expected data bit, the state of the expected data bit is transmitted from the memory device by way of a single output pin to the tester. If one or more of the data bits read out disagree with the expected data bit, the expected data bit is inverted and transmitted out through the single output pin to the tester.

The JEDEC interface specification allows, during a design for test write cycle, a single input pin on a device to substitute for any width input/output available on the device. The specification does not, however, provide a solution for the increasing amount of storage locations in each device.

A block write operation serves to access a larger portion of the memory in a single cycle. A block of addresses in each of the arrays is written with data stored in a block write register located on the memory device. In a block write mode, this block write register is loaded using several input pins on the chip. The block write mode has the advantage of writing multiple storage locations in each of the arrays in a single cycle. It unfortunately does not work with the JEDEC interface because it requires multiple input pins to load the on-chip block write register.

The problem is to find an effective way to design an integrated circuit memory device that incorporates the JEDEC interface specification for testing simultaneously several wide input/out pin memory devices on a single device tester while including a block write feature to write to multiple address locations in a single cycle.

SUMMARY OF THE INVENTION

This and other problems are solved by an integrated circuit memory device that includes plural input/output pins and plural arrays of addressable storage cells. A set of circuits provides access to a storage cell in each array through given row and column addresses. During a test mode, a writing circuit applies plural copies of a test data bit by way of a co,non data-in lead to the arrays for storage in an addressed storage cell in each of the arrays. A readout circuit is arranged for reading out, through a common data-out lead, a result of a comparison between the stored test data bit from the addressed storage cell in each of the arrays and an expected data bit. Alternatively during the test mode, the writing circuit applies the test data bit by way of the common data-in lead for storage in a block of column address locations in each of the arrays.

A test page mode write operation can store a test data bit in plural addressed storage cells along a selected row of each array with only a single row access operation and plural column access operations.

BRIEF DESCRIPTION OF THE DRAWINGS

These and other features of an illustrative embodiment of the invention may be better understood by reading the following detailed description with reference to the drawing wherein:

FIG. 6 presents a truth table for a comparator circuit used in FIG. 1;

FIG. 7 presents a truth table for an output multiplexer used in FIG. 1; and

FIG. 8 presents a truth table for the special function signal generator during normal (NON-DFT) write operations.

DETAILED DESCRIPTION

Block Write Test Mode

Figure 1A:
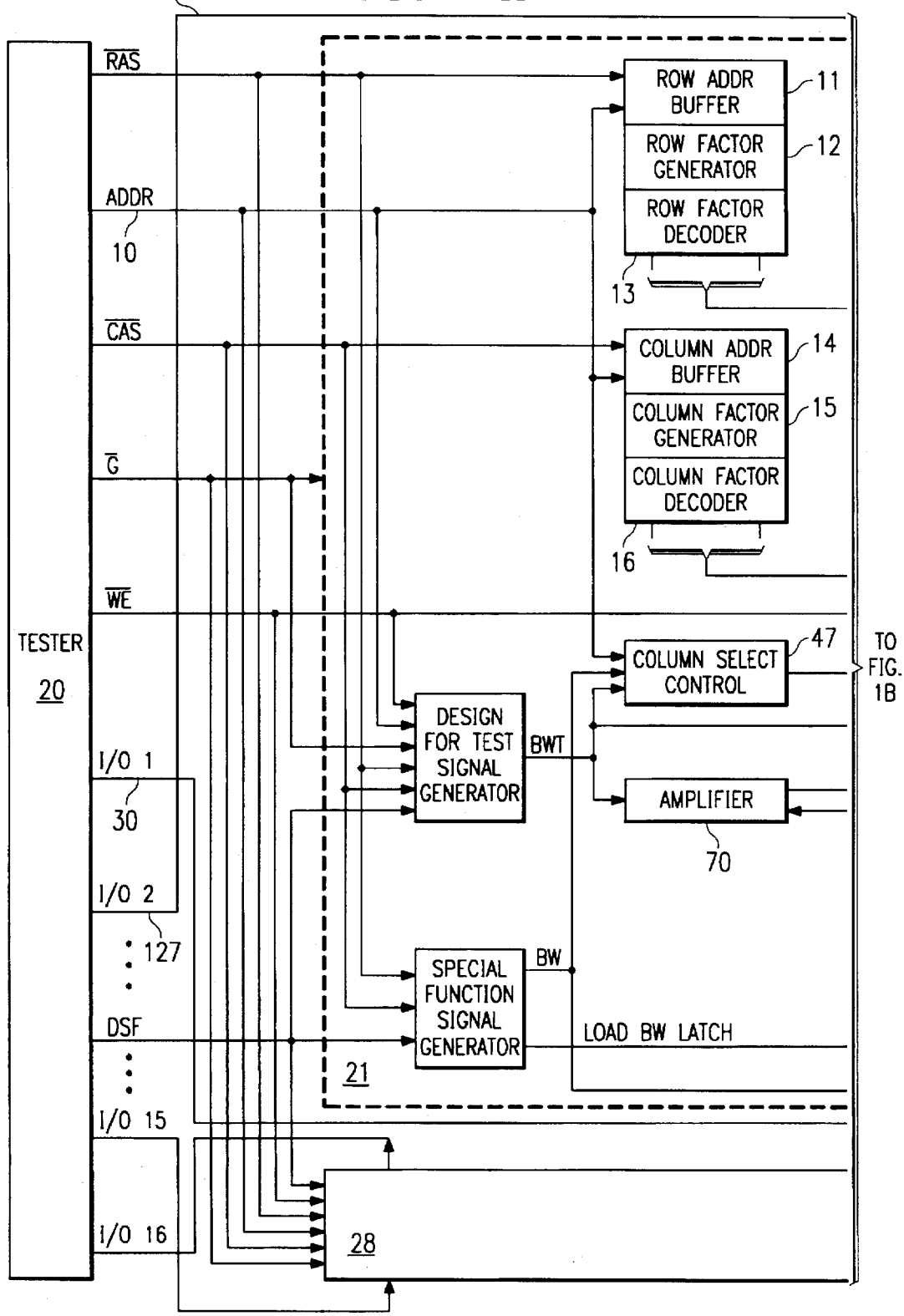
FIGS. 1A and 1B present a block diagram of an arrangement for testing an integrated circuit memory device that has several input/output pins and is designed for test (DFT) with a block write feature.
Figure 1B:
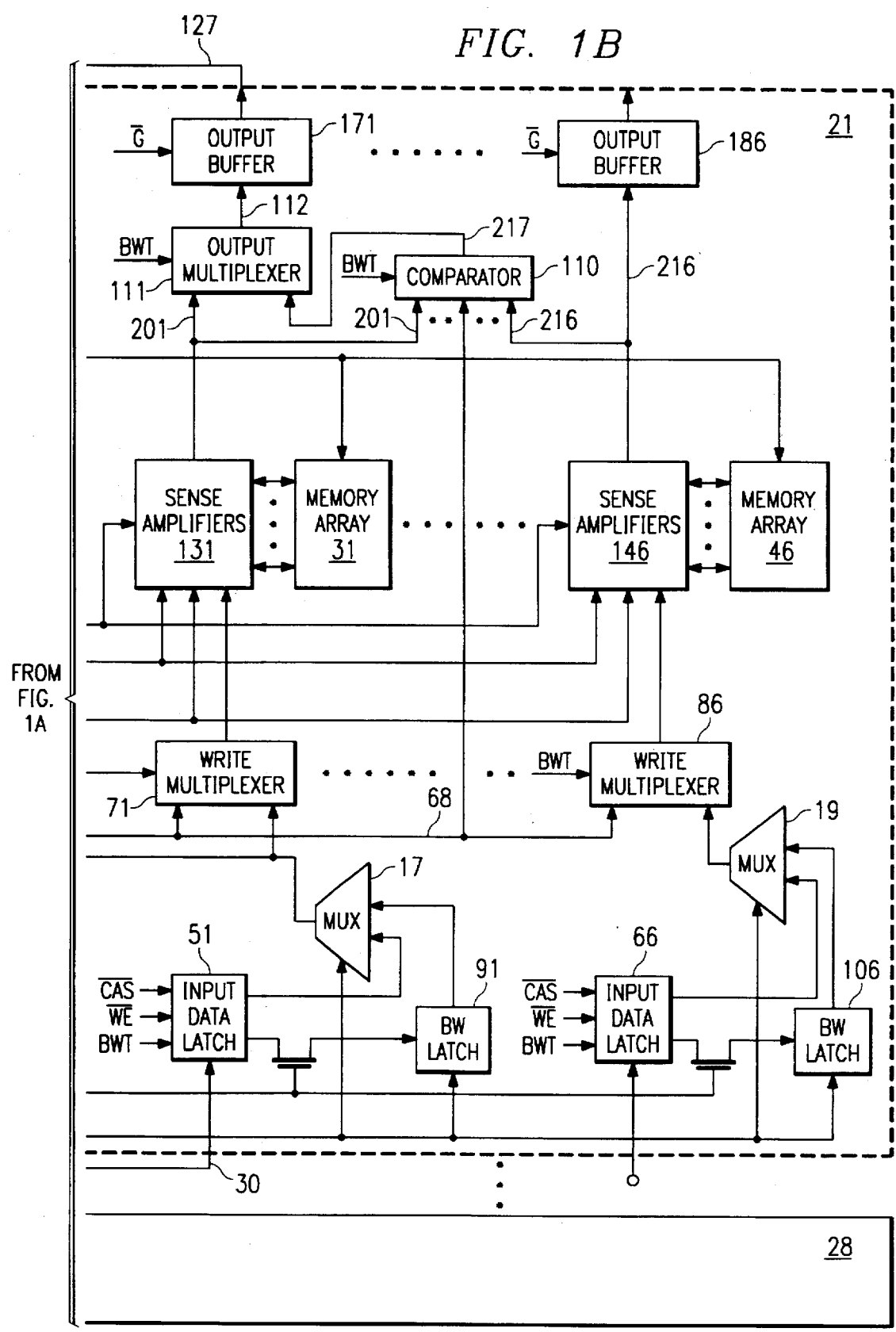

Referring now to FIGS. 1A and 1B, there is shown a block diagram of a tester 20 interconnected with a set of memory devices including eight memory devices 21–28. Only the memory devices 21 and 28 are shown. The others are represented by a series of dots located between the memory devices 21 and 28. Each of the memory devices 21–28 is an integrated circuit, such as the memory device 21 that is designed for test. The memory device 21 includes a group of arrays 31–46 of information storage cells. For example there are sixteen of the arrays of storage cells. Only two of the arrays 31 and 46 are actually shown. The other fourteen arrays are represented by a series of dots located between the arrays 31 and 46. All of the arrays 31–46 are arranged to be accessed by row and column addresses for writing data into an addressed one of the storage cells of each array and for reading data out of an addressed one of the storage cells of each array. An exception to this occurs when column select control circuitry 47 is enabled by a control signal block write (BW) or block write test mode (BWT) so that multiple column addresses are selected simultaneously allowing concurrent access to a several storage cell block in each of the arrays 31–46.

In FIGS. 1A and 1B, only a single input data lead, or pin, 30 is connected between the tester 20 and the memory device 21 at an input data latch 51. Although there are fifteen additional input data leads, or pins and input data latches, e.g., input data latch 52 (not shown) through input data latch 66, for the memory device 21; the tester 20 is only connected through the input data lead, or pin, 30 for supplying input data to the input data latch 51.

Similarly a single output lead 127 interconnects an output buffer 171 of the memory device 21 to the tester 20.

The tester 20, for example, has a total of sixteen input/output connections, eight for input data and eight for output data. In the example presented, one input data lead and one output data lead are used for each memory device. Therefore the tester 20 can be connected to the eight memory devices 21–28 for concurrent testing. A test data bit, generated and transmitted by the tester 20, is applied to and is stored within the input data latch, e.g., input data latch 51, of all eight memory devices 21–28 at once.

For a block write test operation, address signals and common control signals $\overline{WE}$, $\overline{RAS}$, $\overline{CAS}$, $\overline{G}$ and DSF are applied by the tester 20 to each of the memory devices 21–28. In some application specific memory devices, not shown, additional control signals may be used. Additionally input and output data signals I/O are coupled between the tester 20 and the memory devices 21–28. A separate pair of input data and output data leads is connected between the tester 20 and each of the memory devices 21–28. One lead of each of the pairs of input data and output data leads, e.g., input data lead, or pin, 30, is used to supply the test data bit to the associated memory device, e.g., memory device 21. A second one of the leads of the pairs of leads, e.g., output lead 127, is used for transmitting results of a test from the memory device 21 to the tester 20. Since only the memory device 21 is shown in detail, the subsequent description will be directed to the memory device 21, but the other memory devices operate similarly at the same time.

When the memory devices 21–28 are being tested, they are all tested concurrently. For a block write test operation, there are two methods, or modes, for writing test data into the memory devices 21–28. One is a block write test mode. The second is a page block write test mode. For each of the two modes of writing test data, the single test data bit is applied from the tester 20 by way of the separate single input data lead to each of the devices 21–28. In the block write test mode, the test data bit is written simultaneously to a row and a block of columns, decoded by a partial column address. The partial column address accesses a block of storage cells along the selected row in each of the arrays of all of the memory devices 21–28. The test data bit is written simultaneously into all of the storage cells in the selected block.

Figure 2:
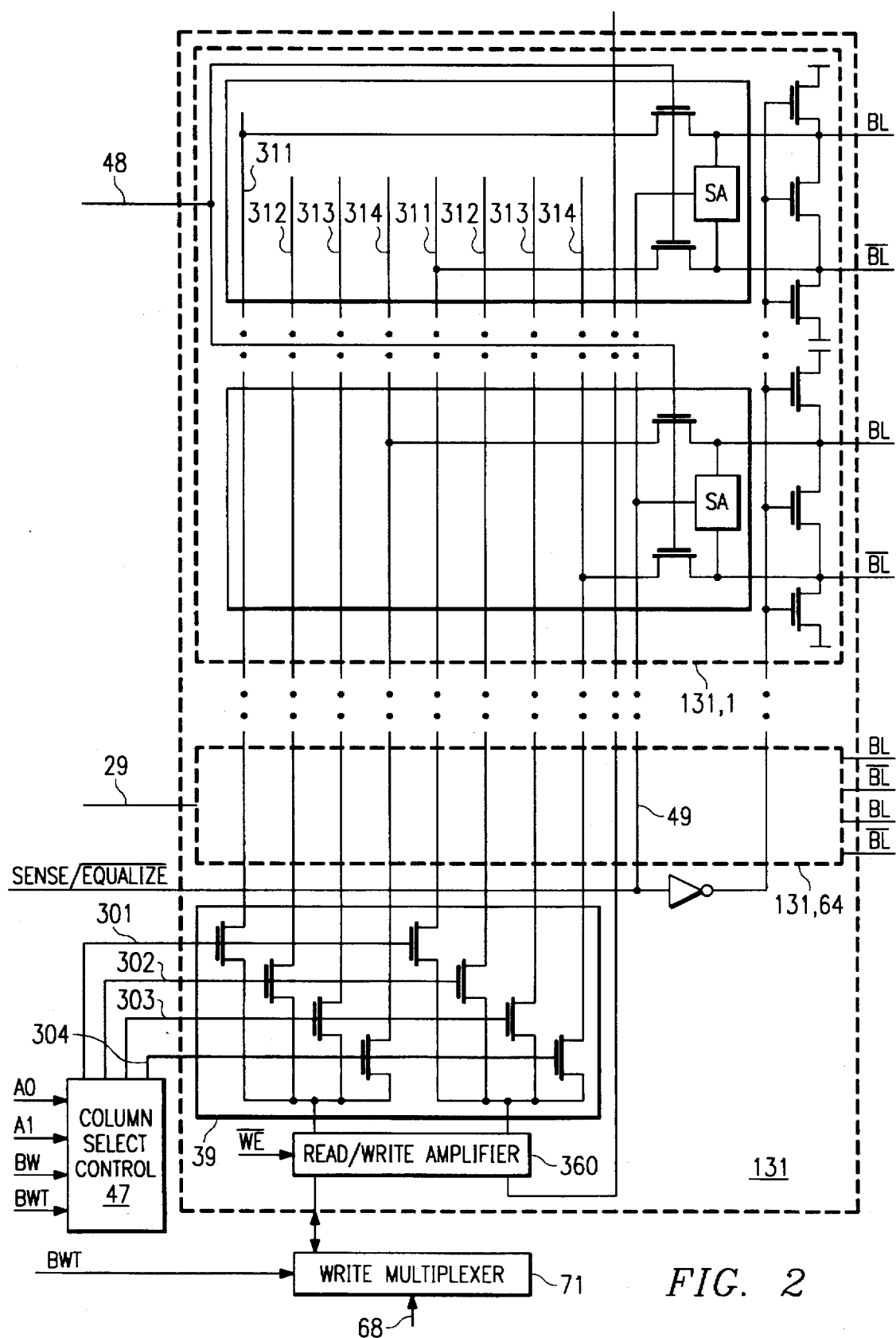
FIG. 2 presents a schematic diagram of the block of sense amplifiers, the column select control circuit, and the write multiplexer of FIG. 1.

With reference to FIG. 2, a block write test operation will be described. The block write test operation uses a special design for test write mode. When an internally generated signal, the block write test signal BWT, is enabled and applied to a column select control circuit 47, all write operations will write to multiple column addresses with timing like the timing described in a U.S. patent application, Ser. No. 988,553, filed Dec. 12, 1992 (TI-17379), and reproduced as the timing diagram of FIG. 3 herein. It is noted that this timing is different from the timing used in a normal block write operation, as described in a U.S. Pat. No. 4,961,171.

Figure 3:
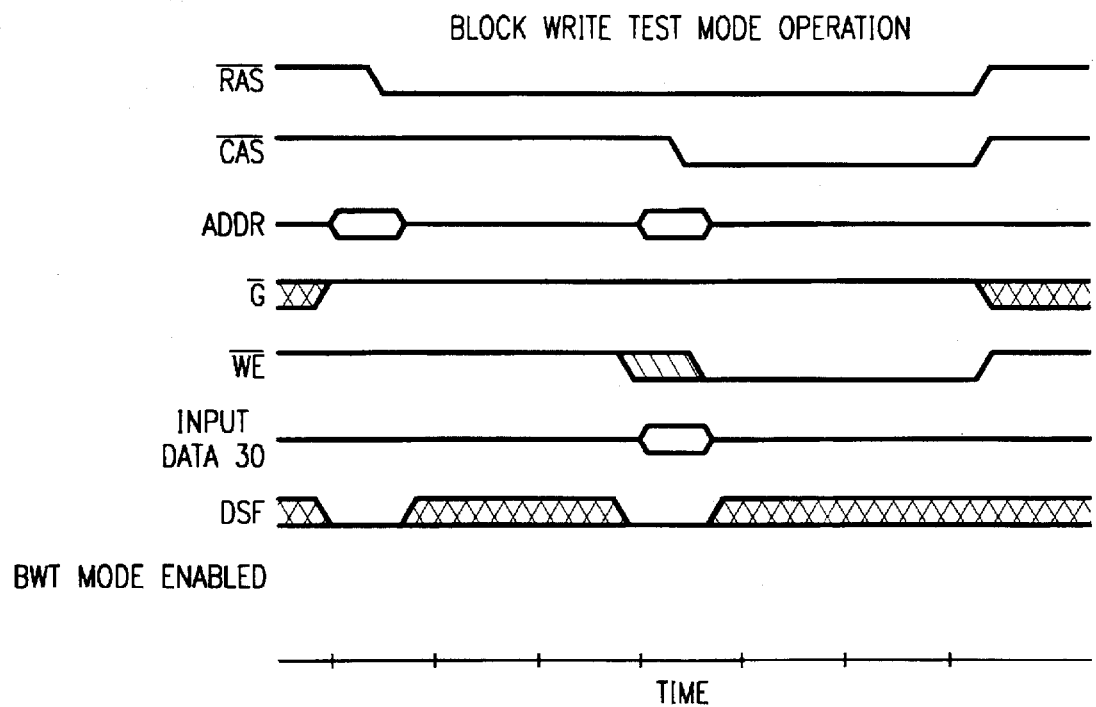
FIG. 3 shows a timing diagram for a block write test mode operation for the arrangement of FIG. 1.

For the block write test operation of FIG. 3, the block write test signal BWT is enabled and a special function select signal DSF is inactive low when both the row access strobe signal $\overline{RAS}$ and the column access strobe signal $\overline{CAS}$ fall. Also, the output enable signal $\overline{G}$ is inactive high for the write cycle. The row access strobe signal $\overline{RAS}$ goes active low and latches a row address from the tester 20 by way of an address bus 10 into a row address buffer 11 of FIG. 1. After the row address has been latched in the row address buffer 11, a set of row factors are decoded from the address by a row factor generator 12 to specify one physical row in each of the arrays 31–46. A row factor decoder 13 uses the row factors to determine which wordline, the same logical wordline in each array, should be valid.

The column access strobe signal $\overline{CAS}$ of FIG. 3 goes active low and latches a column address, received from the tester 20 by way of the address bus 10, into a column address buffer 14 of FIG. 1. The write enable signal $\overline{WE}$ of FIG. 3 also goes low signifying a write cycle. The column address can start to be decoded as soon as the row address strobe signal $\overline{RAS}$ falls. When the column address strobe signal $\overline{CAS}$ falls, the column address is latched and decoded. When the column address is valid, a set of factors produced in a column factor generator 15 decodes the applied address into a logical address on-chip by way of a column factor decoder 16. The logical address denotes the physical location of the column address in the arrays 31–46.

Referring now to FIG. 2, there is shown in detail the arrangement of part of the column decoding circuits of the array 31 of FIG. 1. In FIG. 2, there are shown the column select control circuit 47, a sense amplifier bank 131 including data transfer gates and local input/output lines, and a write multiplexer 71. The arrangement of FIG. 2 performs the final part of the column address decoding.

For a block write test mode operation, the block write test signal BWT is enabled. The most significant bits of the column address are decoded into a 1-of-64 code word for selecting one group, or block, of columns from sixty-four blocks of columns 131.1–131.64. Only two of the block of columns are shown. The others are represented by a series of dots between the blocks of columns 131.1 and 131.64. Only the block of columns 131.1 is shown in detail. The other blocks of columns are arranged similarly except for selection by a different partially decoded column address. For exemplary purposes, it is assumed that the block of columns 131.1 presented in detail is selected by the column address. The active signal on the column select lead 48 enables transfer gates between the local input/output lines and input terminals to each sense amplifier SA associated with the selected block of columns 131.1. Those sense amplifiers SA are enabled for sensing by a sense/equalize signal on a lead 49. The sense/equalize signal on lead 49 is generated by logic internal to the device which is not shown. The block of columns 131.64 is selected when the decoded partial column address puts a column select signal on lead 29.

Also for the block write test mode operation, the column select control circuit 47 is responsive to the block write test signal BWT. During any block write test mode operation, the column select control circuit 47 ignores the least significant bits A0 and A1 of the column address and produces active signals on all four column select control leads 301–304. These active signals enable all of the transfer gates 39 between a read/write amplifier 360 and the local input/output lines, which traverse all of the blocks of columns.

Referring again to FIGS. 1A and 1B, the test data bit, to be written into the memory devices, is generated by the tester 20 and sent concurrently over all of the input data leads to the respective memory devices 21–28. The test data bit is latched into an input data latch 51. The latter of the column access strobe signal $\overline{CAS}$ going low or the write enable signal $\overline{WE}$ going low is used for producing a signal to latch the test data bit DATA IN from the tester 20 into the input data latch 51 of the memory device 21 in FIG. 1. Each of the memory devices 21–28 receives and latches the test data bit in a similar input data latch. Once the data bit is latched into the input data latch 51, it is applied through a multiplexer 17 and an amplifier 70 to a data-in/expected data lead 68. This single data bit is used to write into a block of column addresses in each array 31–46.

The memory device 21 is arranged specially for testing. For instance, the input data latch 51 has an output lead connected through a multiplexer 17 to an input of an amplifier 70, which drives the test data bit from the input data latch 51 over a common data-in/expected data lead 68 that splits into short parallel branches going to a test data input of each of sixteen write multiplexers 71–86. Other input data latches, e.g., 52(not shown)–66, do not have an amplifier analogous to the amplifier 70 because those other input data latches each apply the test data bit to only one write multiplexer. Advantageously the common data-in/expected data lead 68 requires less device area than is required by any arrangement needing plural data-in leads routed across the memory device 21.

Only the write multiplexers 71 and 86 are shown in FIG. 1B. The other fourteen write multiplexers are represented by a series of dots located between the write multiplexers 71 and 86. All of the write multiplexers test data inputs are located on the lefthand side of the multiplexers 71–86. Those inputs are selected by the block write test signal BWT that is applied to each of the multiplexers.

Reference is again made to FIG. 2. While the test data bit is applied to the write multiplexer 71 and the transfer gates 39 are enabled, the single test data bit is transmitted through the write multiplexer 71, a read/write amplifier 360, and all of the transfer gates 39 to the local input/output lines. The test data bit on all of the local input/output lines is sensed by each of the enabled sense amplifiers SA of the block of columns 131.1 and is applied directly to four bitline pairs BL, $\overline{BL}$. The block of storage cells located at the intersection of the selected row and the selected pairs of bitlines of the group of columns receive and store the test data bit. The selected block of storage cells are not shown.

Referring again to FIG. 1, the test data bit from the data latch 51 overwrites data in the addressed and selected storage cells in the selected row. The number of column locations that are written is determined by the number of column addresses which are available on the device. For the example block write test mode, four column addresses are available for accessing a single block in each array.

When activated during a write operation, the sense amplifier banks 131–146 initially amplify the prior states of the respective storage cells, but because the write cycle is a block write test BWT mode cycle, the test data bit in the data latch 51 is applied, through the write multiplexer 71, onto all of the column addresses in the selected block. The column select control circuit 47 disregards the column address bits A0 and A1 and a column mask to make all of the column select control lines active. The state of the test data bit in the data latch 51 is applied to the entire block of the column addresses decoded by the column factor decoder 16. The prior states of the selected storage cells in the arrays 31–46 are overwritten by the data test bit from the write multiplexers 71–86.

Design for Test—Special Functions

In page block write test mode, a single row in each array of all of the memory devices 21–28 is addressed and selected, and the test data bit is written into a series of blocks of column addresses along the selected row. The row is addressed once and multiple partial column addresses are accessed successively while the row remains selected.

Figure 4:
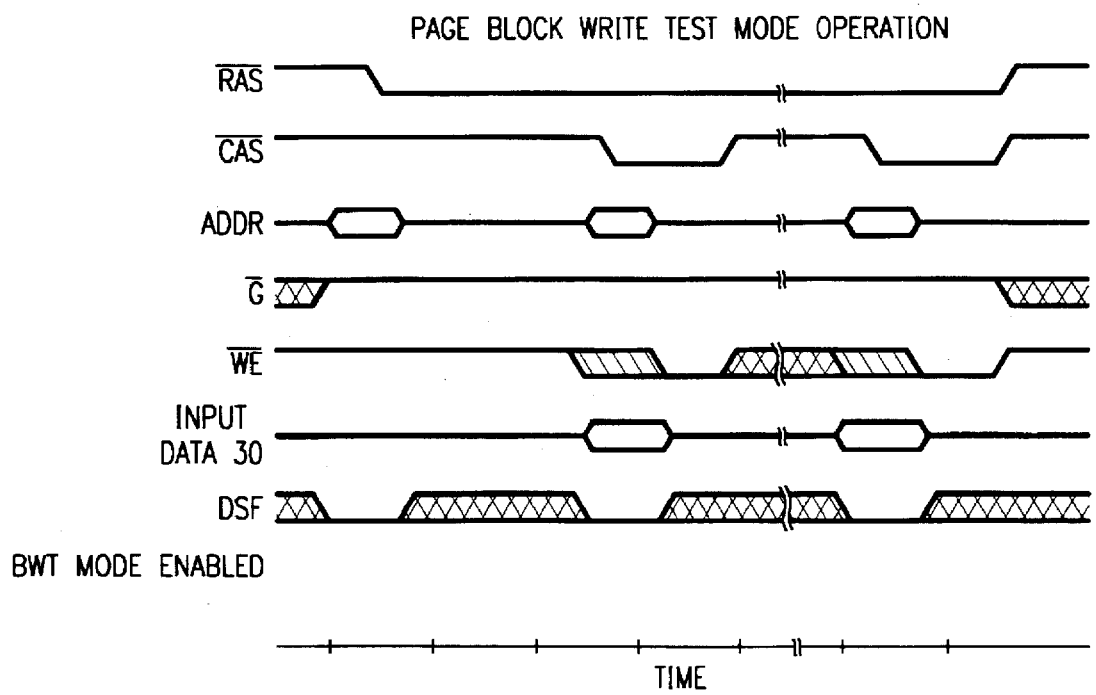
FIG. 4 shows a timing diagram for a page block write test mode operation for the arrangement of FIG. 1.

The page block write test mode also can be used with the architecture of FIGS. 1A and 1B. In a page mode cycle, row address strobe $\overline{RAS}$ falls to latch the row address, but the column address strobe signal $\overline{CAS}$ can be brought low and high repeatedly, as shown in FIG. 4. Each time that column address strobe signal $\overline{CAS}$ falls, a new column address is accessed. The row remains the same because it maintains the same latched data commencing when the row address strobe signal $\overline{RAS}$ falls at the beginning of the cycle. Since the row address only is decoded once, randomly selected blocks of column addresses can be accessed more quickly because only the column address must be decoded for each new storage location. Page block write test mode can be used to write randomly selected blocks on a single row.

Referring to FIG. 4, there is shown a timing diagram for the arrangement of FIGS. 1A and 1B during a page block write test mode operation. The output enable signal $\overline{G}$ is inactive high. As shown, the row address is latched into the memory device in response to the row access strobe signal $\overline{RAS}$ going low. A first column address is latched into the memory device in response to the column access strobe signal $\overline{CAS}$ going low a first time. The write enable signal $\overline{WE}$ goes low to signify a write operation. The test data bit, valid on the input data lead 30 at the time when the latter of the column access strobe signal $\overline{CAS}$ or the write enable signal $\overline{WE}$ goes low the first time, is latched into the input data latch 51 of the memory device 21 and subsequently is stored in the arrays 31–46 at, for example, sixty-four storage cells, i.e., four storage cells in each of the arrays 31–46.

In a block write test mode, a block write occurs for all write cycles. A normal write (DSF low during the fall of row and column access strobe signals $\overline{RAS}$ and $\overline{CAS}$), as shown in FIG. 8 and in the timing diagram of FIG. 4, will still result in a block write as long as the block write test BWT signal is enabled.

When the column access strobe signal goes low a second time, another test data bit on the input data lead 30 is latched into the data latches 51 of the memory device and subsequently is stored in the arrays 31–46 at a second addressed block of four storage cells in each of the sixteen arrays. These second addressed storage cells are in the same row as the first addressed storage cells but may be at any column address controlled by the second column address. In this design for test page block write test mode operation, the tester writes a series of test data bits into the selected block of storage cells of a single row of the arrays by selecting the row address only one time and then selecting a number of column addresses.

Design for Test Mode—Read

To complete the test operation of the arrangement of FIGS. 1A and 1B, the data written to each of the arrays 31–46 must be read out. This can be accomplished in a subsequent cycle. The test data bit stored in each of the arrays 31–46 is read out from all of the arrays at once. Within the device 21, all of the read out test data bits are compared with an expected data bit applied by the tester 20 through the lead 30, the data latch 51, the multiplexer 17, the amplifier 70, and the data-in/expected data lead 68 directly to a comparator circuit 110. Comparator circuit 110 also receives read out data from each of the sense amplifier banks 131–146 of the device 21. Comparator circuit 110 can be arranged like the comparison and common line circuits disclosed in the previously mentioned patent application Serial Number 988,553. The result of each of the comparisons is transmitted through line 217 to the output multiplexer 111.

Figure 5:
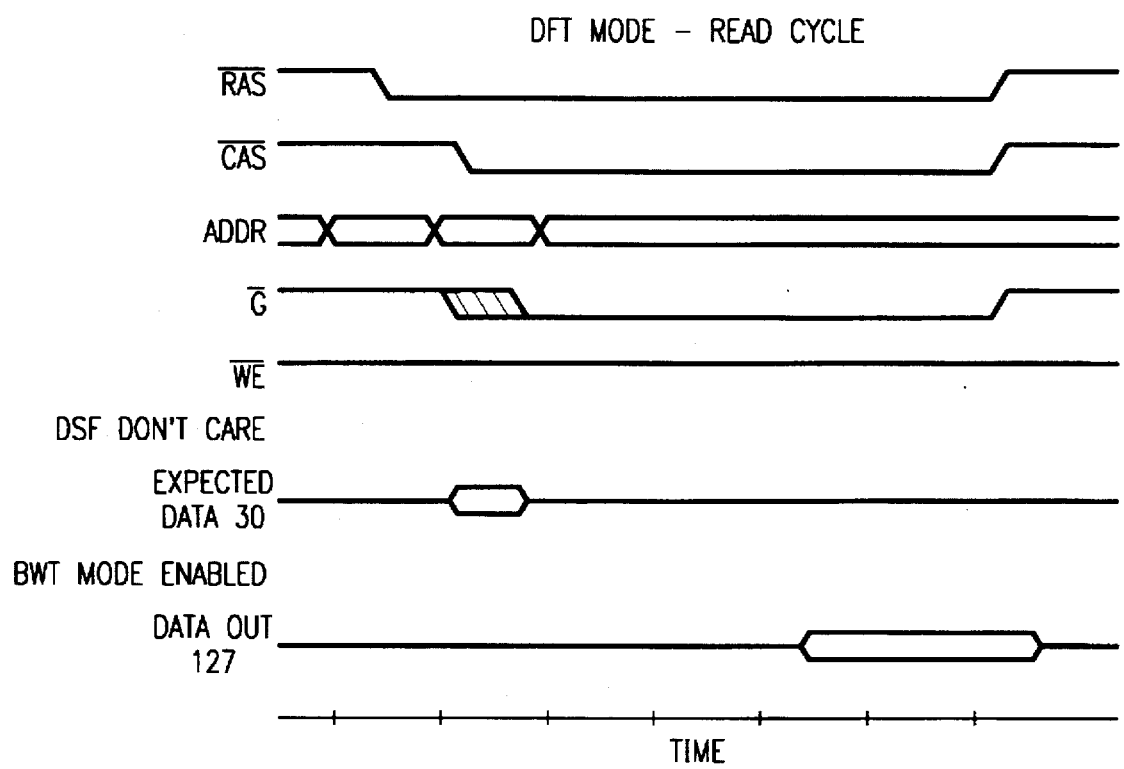
FIG. 5 shows a timing diagram for a DFT mode read operation for the arrangement of FIG. 1.

With reference to FIG. 5, we shall describe a test readout operation. To commence the test readout operation, the design for test signal BWT is enabled and the write enable signal $\overline{WE}$ is inactive high. Row and column addresses are latched into the respective row and column address buffers, in response to the row access strobe signal $\overline{RAS}$ and the column access strobe signal $\overline{CAS}$. The signal DSF is a don't care. An expected data bit, similar in state to the test data bit, is applied from the tester 20 of FIG. 1 through the input lead 30 to the input data latch 51 and is latched on the falling edge of the column access strobe signal $\overline{CAS}$. Although what is shown in FIG. 5 is as just described, the expected data bit can be latched into the input data latch 51 when the row access strobe signal $\overline{RAS}$ falls. From the input data latch 51 of FIG. 1B, the expected data bit passes through the multiplexer 17, is amplified by the amplifier 70, and is fanned out by way of the common data-in/expected data lead 68 and the short parallel branches to the write multiplexers 71–86 and to an input of the comparator circuit 110. The output enable signal $\overline{G}$ goes active low around the time that the column access strobe signal $\overline{CAS}$ goes low to enable output buffers 171–186 when valid data arrives at an input to the output buffer 171.

A high state of the write enable signal $\overline{WE}$ disables the sense amplifier banks 131–146 from receiving the expected data bit from the write multiplexers 71–86. When the column access strobe signal $\overline{CAS}$ falls to its low level, the single addressed test data bit stored in each of the arrays 31–46 is read out to the respective sense amplifier banks 131–146 even though multiple bits could have been stored using the block write test mode cycle. Although a common test data bit was written into each of the arrays 31–46, because of flaws or defects left during fabrication of the device, all of the arrays may not actually store the same bit state at the selected address. If one or more of the stored bits is in a different state in the commonly addressed bit locations of the different arrays 31–46, there is a fabrication or logic fault which is to be detected as a result of the test readout operation. Whatever the state of the bit read from each array, the associated sense amplifiers detect the state and transmit it to the comparator circuit 110.

Consider, as shown in FIG. 6, a truth table describing the operation of the comparator circuit 110 of FIG. 1B. When all of the input signals on leads 201–216 are like the expected data bit, the comparator produces a signal on line 217 which is the same as the expected data bit. If any input signal on leads 201–216 differs from the expected data bit, the inverse of the expected bit is transmitted on line 217 to the output multiplexer 111. Only leads 201 and 216 are shown. Others of the leads are represented by a series of dots between the leads 201 and 216.

Referring now to FIG. 7, there is shown a truth table for the functions of the output multiplexer 111 of FIG. 1B. The output multiplexer 111 is placed on the device 21 only once where it is associated with the output buffer 171 that connects by way of the output data lead, or pin, 127 to the device tester 20. There are two data inputs and one control input for the output multiplexer 111. The data input, on lead 201, provides the state of the selected one of the sense amplifiers in the bank 131. The other data input, on the lead 217, represents either the result of the comparison when the block write test signal BWT is enabled or a DON'T CARE condition from the comparator circuit 110 during regular operations when the block write test signal BWT is disabled.

Consider now the operation of the output multiplexer 111. When the block write test signal BWT is enabled, the state of the selected one of the sense amplifiers of the bank 131 is disabled from affecting the output of the output multiplexer 111. Therefore, the truth table of FIG. 6 shows a DON'T CARE condition for the input from the sense amplifier data on the lead 201. Also while the block write test signal BWT is enabled, the state of the data on lead 217 determines the output state of the output multiplexer 111 on lead 112. This output state of the output multiplexer 111 depends upon the state of the output of the comparator circuit 110. For instance, when the comparator circuit inputs, applied from all of the arrays 31–46, all match the expected data bit on the data-in/expected data lead 68, the output state of the multiplexer 111 on a lead 112 agrees with the expected data bit on the data-in/expected data lead 68. Alternatively when the comparator circuit input data from one or more of the arrays 31–46 does not match the expected data bit on the data-in/expected data lead 68, the output state of the multiplexer 111 on the lead 112 is an inversion of the expected data bit on the data-in/expected data lead 68.

The output signal from the multiplexer 111 on the lead 112 is latched into the output buffer 171. This output signal, amplified by the output buffer 171, is then transmitted over the output lead 127 to an input/output terminal of the tester 20.

When the block write test signal BWT is enabled, the test result signal sent to the tester 20 either is the same as the expected data bit, when all of the read out test bits from the arrays 31–46 match the expected data bit, or is an inversion of the expected data bit when one or more of the read out test bits do not match the expected data bit. This test result signal sent to the tester 20 from the memory device 21 together with information similarly sent from the other memory devices 22–28, is analyzed for detected faults in the devices 21–28. Results of the analysis are stored in the tester 20 for subsequent passing of good devices for commercial use, repairing of some devices before commercial use, or rejecting some devices to prevent their commercial use.

Regular Operation in a Data Processing System

Referring once again to FIGS. 1A and 1B, the memory device 21 can be operated in a regular operating mode when it is not being tested by the tester 20 of FIG. 1A. In the regular operating mode, the memory device 21 is interconnected with a microprocessor (not shown) rather than the tester 20, and the block write test signal BWT is disabled. Data leads from the microprocessor are connected to each of the sixteen input data leads of the memory device 21. The input data, on those leads, is latched into each of the input latches 51–66. Although they are indicated as present in the test arrangement of FIGS. 1A and 1B, none of the other memory devices 22–28, shown in FIGS. 1A and 1B, is necessarily connected to the microprocessor.

For a regular write-in operation to the memory device 21, a different data bit can be latched into each of the input data latches 51–66, and each data bit traverses a separate circuit path to the right-hand input of one of the associated write multiplexers 71–86. The data bits are latched in the data latches 51–66 on the fall of the later of the column address strobe signal $\overline{CAS}$ or the write enable signal $\overline{WE}$. Thus different data can be transmitted through the multiplexers 71–86. Since the block write test signal BWT is disabled, those data bits, which are applied to the righth-and inputs of the write multiplexers 71–86, are transmitted by the write multiplexers 71–86 to the selected sense amplifiers SA in the banks of sense amplifiers 131–146. Both the row and column addresses are specified, and a row of storage cells of each array is connected to the associated bank of sense amplifiers. The data bits are written into the addressed storage cells of the respective arrays 31–46 and are stored therein.

When the memory device 21 is in regular operation, the amplifier 70 is not enabled. The state of the lead 68 is held at ground when the memory device 21 is not being operated in the block write test mode, i.e., the block write test signal BWT is disabled.

For a regular readout operation, those stored different data bits can be read out from the addressed storage location of each of the several arrays 31–46 to the respective sense amplifier banks 31–146. The state from each of the sense amplifier banks 131–146 is forwarded through a respective output buffer 171–186 and an output data lead to the microprocessor. There are sixteen output buffers 171–186 but only the output buffers 171 and 186 are shown. The other fourteen output buffers are represented by a series of dots between the output buffers 171 and 186.

Once again the output multiplexer 111 provides an advantageous operational feature. As shown in the truth table of FIG. 7, during regular operation, the block write test signal BWT is disabled, cutting off the comparator signal on the lead 217. Thus the signal level from the comparator circuit 110 is a DON'T CARE condition. There is no expected data bit because there is no tester in the microprocessor-memory device arrangement. The output signal produced on the lead 112 is simply the same as the readout data signal from the selected one of the sense amplifier 131 as it occurs on the lead 201.

In normal, or non-BWT mode, operation, a cycle is used to load the block write registers 91–106 with data to be used in subsequent memory cycles. A non-BWT block write cycle occurs when the signal DSF is in-active low at the fall of the row access strobe signal $\overline{RAS}$ and is active high at the fall of the column access strobe signal $\overline{CAS}$, as shown in FIG. 8.

When block write BW is enabled, a single data bit is written into and is stored in the same block addresses in each of the arrays 31–46. In the block write cycle, row and column addresses are specified to activate a particular row of storage cells and a block of sense amplifiers selected by a partial column address. While the write enable signal $\overline{WE}$ is active low, all of the sense amplifier banks 131–146, associated respectively with each of the arrays 31–46, are enabled. The sense amplifiers, selected by the column addresses, are driven to the state of the applied input data bit which is stored in a BW latch, such as BW latch 91. The column decode chain decodes the most significant bits of the column address. This is a partial decode of tire column address. The partially decoded address accesses the block of sense amplifiers SA within the sense amplifier banks 131–146. The accessed group, or block, of sense amplifiers SA is at fixed column address boundaries within each of the arrays 31–46. The decoded partial column address, represented by an enabling signal on 1-of-64 leads like leads 48 and 29 in FIG. 2, determines which of the block of columns has its sense amplifiers SA connected to local input/output lines. While in the block write BW mode, some or all of the outputs from the column select control circuit 47 are active high when a write operation occurs, as determined by a block write mask. The column select control circuit 47 then allows the applied data bits from the BW latches through the mux 17–19 to drive the selected block local input/output data lines in each bank of sense amplifiers 131–146 and overwrite the data in the selected block of storage cells in each array 31–46. For example, consider that four local input/output data pairs 311–314 of FIG. 2 are included in each bank of sense amplifiers SA. The applied data bit could be written to the four addressed storage cells in the associated array. The states of the applied data bits are written into each of the arrays 31–46 at the group of addressed bit positions and is stored therein for subsequent use. This gives the block write feature the ability to write the applied data bits into four addressed storage cells in each of the sixteen arrays 31–46 during one write cycle.

In block write BW operation, the block write function is further enhanced with a write mask, a color mask, and a color register as described in U.S. Pat. No. 4,961,171. Each of the sixteen input data latches 51–66 of FIG. 1 has an associated one of the block write registers 91–106 attached to the input of the memory device. Only two of the block write registers are shown specifically in FIG. 1B. The rest are represented by a series of dots. The block write registers 91–106 are used during normal operation with a microprocessor when all input leads are connected. The data for the color register in the BW latch 91 is loaded during its own cycle by the load BW latch signal. The data for each mask can be loaded into write mask and column mask registers in the BW latch 91 during every block write cycle by a signal similar to the load BW latch signal. Also, a persistent cycle can use the same write mask data several times. The write mask data determines whether data on any of the addressed block of local input/output lines for an array are written into the addressed memory cells. The column mask data, contained in the column mask register, determines which of the block write registers is connected to the addressed local input/output data lines for application of the data contained in the color register. When the block write register is connected, the data stored in the color register is placed on the local input/output data lines so that it overwrites the initial sense amplifier data into the addressed storage cells. If the color mask data is not put on the local input/output data lines, the states of the addressed storage cells remain unchanged.

A slightly modified version of the memory devices 21–28 could also be tested effectively by the tester 20. As an alternative, sixteen common input/output data connections can be made between the tester 20 and the memory device 21. If the alternative sixteen input/output connection arrangement is used, then sixteen memory devices can be tested at once. The modification to the memory devices 21–28 is to substitute common input/output data pins for separate input data pins and output data pins. As long as each device, e.g. memory device 21, has common input/output data pins, a suitable input data multiplexer, and a suitable output data multiplexer, the described design for test procedure can be used.

Advantages

In view of the memory device space savings made by using both the common data-in/expected data lead 68 and the column select control circuit 47, the described block write test mode arrangement has a significant advantage over prior art parallel block write test mode arrangements. Most of the column select circuitry is a regular part of any memory device which incorporates the block write feature. The column select control circuit 47, however, has been modified to work with the block write test mode. The smaller device space requirement means that the beneficial parallel write/read test can be performed at a minimal cost per device while reducing the required test time per device.

The foregoing description covers the arrangement and operation of a memory device having a plurality of separate input data leads output data leads and the arrangement and regular operation of a memory device which has a plurality of common input/output leads. Testing can be accomplished quickly and effectively for either type of memory device. Several memory devices each with a plurality of separate or common input/output leads can be tested concurrently by a single tester 20. The subject matter of the memory device arrangement and of the testing method, described herein, and other matters which are obvious in view thereof are considered to be within the scope of the appended claims.

What is claimed is:

1. An integrated circuit memory device comprising:
    a plurality of input/output pins;
    plural arrays of addressable storage cells;
    a writing circuit for applying, through a common data-in lead, plural copies of a test data bit, applied through one of the input/output pins, for storage in an addressed storage cell in each of the plural arrays of addressable storage cells;
    a circuit, including the common data-in lead, for receiving an expected data bit;
    a readout circuit for reading out through common data-out lead a result of a comparison between the test data bits stored in the addressed storage cell in each of the plural arrays of addressable storage cells and an expected data bit, wherein the test data bits stored in each of the plural arrays of addressable storage cells are simultaneously retrieved and compared with the expected data bit to provide a common comparison bit to be applied to the common data-out lead; and the writing circuit being arranged to apply the test data bit byway of the common data-in lead for writing simultaneously in multiple column address locations in each of the plural arrays.

2. An integrated circuit memory device, in accordance with claim 1, wherein
    the writing circuit includes a row address circuit for accessing a single row of the arrays and a column address circuit for accessing a block of internal data lines for writing simultaneously the test data bit in the multiple column address locations in each of the plural arrays.

3. An integrated circuit memory device, in accordance with claim 2, wherein
    the readout circuit includes the row address circuit for accessing the single row of each of the plural arrays and the column address circuit for accessing an individual internal data line for reading the test data bit stored in one of the multiple column address locations in each of the plural arrays.

4. An integrated circuit memory device, in accordance with claim 3, wherein
    the readout circuit further includes a comparator circuit for comparing the test data bits with an expected data bit.

5. An integrated circuit memory device, in accordance with claim 4, wherein
    the plurality of input/output pins comprise:
    a plurality of separate pins for carrying input data bits; and
    a plurality of separate pins row carrying output data bits.

6. An integrated circuit memory device, in accordance with claim 4, wherein
    the plurality of input/output pins are a plurality of pins, each pin carrying both input and output data bits.

7. An integrated circuit memory device, in accordance with claim 1, wherein
    the readout circuit includes a row address circuit for accessing a single row of the plural arrays and a column address circuit for accessing an individual internal data line for reading the test data bit from one of the multiple column address locations in each of the arrays.

8. An integrated circuit memory device, in accordance with claim 1, wherein
    the readout circuit includes a row address circuit for accessing a single row of the arrays and a column address circuit or accessing an individual internal data line for reading the test data bit from one of the multiple column address locations in each of the plural arrays; and
    the readout circuit further includes a comparator circuit for comparing the test data bits with an expected data bit.

9. An integrated circuit memory device, in accordance with claim 1, wherein
    the plurality of input/output pins comprise:
    a plurality of separate input data pins; and
    a plurality of separate output data pins.

10. An integrated circuit memory device, in accordance with claim 1, wherein
    the plurality of input/output pins are a plurality of pins, each pin carrying both input and output data bits.

11. An integrated circuit memory device comprising:
    a plurality of input/output pins;
    a plurality of arrays of addressable storage cells;
    a page mode writing circuit for applying through a common data-in lead plural copies of a test data bit, received through one of the plurality of input/output pins, for simultaneous storage in plural addressed storage cells for each column access operation along a selected row in each of the plurality of arrays of addressable storage cells with only a single row access operation and plural column access operations;

a circuit, including the common data-in lead, for receiving an expected data bit; and a readout circuit including a common data-out lead for reading out and comparing simultaneously the test data bits from the addressed storage cells along the selected row in each of the plurality of arrays of addressable storage cells, a common comparison bit resulting from the simultaneous comparing being applied to the common data-out lead.

12. An integrated circuit memory device, in accordance with claim 11, wherein the page mode writing circuit includes a row address circuit for accessing a single row of each of the plural arrays and a column address circuit for accessing a block of internal data lines for writing simultaneously the test data bit in multiple column address locations in each of the plurality of arrays.

13. An integrated circuit memory device, in accordance with claim 12, wherein the readout circuit includes the row address circuit for accessing the single row of the arrays and the column address circuit for accessing an individual internal data line for reading the test data bit from one of the multiple column address locations in each of the plurality of arrays.

14. An integrated circuit memory device, in accordance with claim 13, wherein the readout circuit further includes a comparator circuit for comparing the test data bits with an expected data bit.

15. An integrated circuit memory device, in accordance with claim 14, wherein the plurality of input/output pins comprise:
a plurality of separate pins for carrying input data bits; and
a plurality of separate pins for carrying output data bits.

16. An integrated circuit memory device, in accordance with claim 11, wherein the plurality of input/output pins are a plurality of pins, each pin carrying both input and output data bits.

17. An integrated circuit memory device, in accordance with claim 11, wherein the readout circuit includes a row address circuit for accessing a single row of the plurality of arrays and a column address circuit for accessing an individual internal data line for reading the test data bit from one of the multiple column address locations in each of the plurality of arrays.

18. An integrated circuit memory device, in accordance with claim 11, wherein the readout circuit includes a row address circuit for accessing a single row of the plurality of arrays and a column address circuit or accessing an individual internal data line for reading the test data bit from one of the multiple column address locations in each of the plurality of arrays; and the readout circuit further includes a comparator circuit for comparing the test data bits with an expected data bit.

19. An integrated circuit memory device, accordance with claim 11, wherein the plurality of input/output pins comprise:
a plurality of separate input data pins; and
a plurality of separate output data pins.

20. An integrated circuit memory device, in accordance with claim 11, wherein the plurality of input/output pins are a plurality of pins, each pin carrying both input and output data bits.

* * * * *